(12) United States Patent
Bowman et al.

(10) Patent No.: US 9,947,406 B2
(45) Date of Patent: Apr. 17, 2018

(54) DYNAMIC TAG COMPARE CIRCUITS EMPLOYING P-TYPE FIELD-EFFECT TRANSISTOR (PFET)-DOMINANT EVALUATION CIRCUITS FOR REDUCED EVALUATION TIME, AND RELATED SYSTEMS AND METHODS

(71) Applicant: QUALCOMM Incorporated, San Diego, CA (US)

(72) Inventors: Keith Alan Bowman, Morrisville, NC (US); Francois Ibrahim Atallah, Raleigh, NC (US); David Joseph Winston Hansquine, Raleigh, NC (US); Jihoon Jeong, Cary, NC (US); Hoan Huu Nguyen, Durham, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/860,844

(22) Filed: Sep. 22, 2015

(65) Prior Publication Data
US 2016/0247568 A1     Aug. 25, 2016

Related U.S. Application Data

(60) Provisional application No. 62/119,769, filed on Feb. 23, 2015.

(51) Int. Cl.
*G11C 15/04* (2006.01)
*G11C 11/40* (2006.01)
(Continued)

(52) U.S. Cl.
CPC .............. *G11C 15/04* (2013.01); *G11C 11/40* (2013.01); *H03K 19/00315* (2013.01); *H03K 19/094* (2013.01)

(58) Field of Classification Search
CPC ....................................................... G11C 15/04
(Continued)

(56) References Cited

U.S. PATENT DOCUMENTS

| 4,623,989 A | 11/1986 | Blake |
| 5,422,838 A * | 6/1995 | Lin .......................... G11C 15/04 |
| | | 365/189.02 |

(Continued)

OTHER PUBLICATIONS

Cheng, K-L., et al., "A Highly Scaled, High Performance 45nm Bulk Logic CMOS Technology with 0.242 µm² SRAM Cell," IEDM 2007, IEEE International Electron Devices Meeting, Washington, DC, 2007, pp. 243-246.

(Continued)

*Primary Examiner* — Son Mai
(74) *Attorney, Agent, or Firm* — W&T/Qualcomm

(57) ABSTRACT

Dynamic tag compare circuits employing P-type Field-Effect Transistor (PFET)-dominant evaluation circuits for reduced evaluation time, and thus increased circuit performance, are provided. A dynamic tag compare circuit may be used or provided as part of searchable memory, such as a register file or content-addressable memory (CAM), as non-limiting examples. The dynamic tag compare circuit includes one or more PFET-dominant evaluation circuits comprised of one or more PFETs used as logic to perform a compare logic function. The PFET-dominant evaluation circuits are configured to receive and compare input search data to a tag(s) (e.g., addresses or data) contained in a searchable memory to determine if the input search data is contained in the memory. The PFET-dominant evaluation circuits are configured to control the voltage/value on a dynamic node in the dynamic tag compare circuit based on the evaluation of whether the received input search data is contained in the searchable memory.

42 Claims, 7 Drawing Sheets

(51) Int. Cl.
*H03K 19/003* (2006.01)
*H03K 19/094* (2006.01)

(58) Field of Classification Search
USPC .................................................. 365/49.17
See application file for complete search history.

(56) References Cited

U.S. PATENT DOCUMENTS

| | | | | |
|---|---|---|---|---|
| 5,446,685 | A * | 8/1995 | Holst | G06F 12/1027 365/154 |
| 5,453,948 | A * | 9/1995 | Yoneda | G11C 15/04 365/203 |
| 5,699,288 | A * | 12/1997 | Kim | G11C 15/04 365/189.07 |
| 5,701,095 | A | 12/1997 | Ohsawa | |
| 5,703,803 | A | 12/1997 | Shadan et al. | |
| 6,195,278 | B1 * | 2/2001 | Calin | G11C 15/00 365/189.07 |
| 6,205,068 | B1 | 3/2001 | Yoon | |
| 6,449,202 | B1 | 9/2002 | Akatsu et al. | |
| 6,522,562 | B2 * | 2/2003 | Foss | G11C 15/04 365/168 |
| 6,529,395 | B1 | 3/2003 | Afghahi et al. | |
| 6,760,241 | B1 * | 7/2004 | Gharia | G11C 15/043 365/189.07 |
| 6,903,952 | B2 * | 6/2005 | Afghahi | G11C 15/04 365/154 |
| 7,009,861 | B2 * | 3/2006 | Dixit | G11C 15/04 365/156 |
| 7,038,962 | B2 | 5/2006 | Yamagami | |
| 7,064,584 | B2 | 6/2006 | Bertram et al. | |
| 7,102,904 | B1 * | 9/2006 | Kwack | G11C 15/04 365/189.08 |
| 7,256,621 | B2 | 8/2007 | Lih et al. | |
| 7,403,426 | B2 | 7/2008 | Hamzaoglu et al. | |
| 7,474,546 | B2 * | 1/2009 | Shastry | G11C 15/04 365/203 |
| 8,427,896 | B1 | 4/2013 | Agarwal et al. | |
| 8,488,369 | B2 | 7/2013 | Chandra et al. | |
| 8,576,649 | B1 | 11/2013 | Nemati | |
| 8,837,188 | B1 * | 9/2014 | Krishnamurthy | G11C 15/046 365/49.1 |
| 2002/0126519 | A1 | 9/2002 | Foss | |
| 2004/0114411 | A1 * | 6/2004 | Noda | G11C 15/043 365/49.17 |
| 2004/0252536 | A1 | 12/2004 | Ferrant | |
| 2005/0135136 | A1 | 6/2005 | Regev et al. | |
| 2007/0014139 | A1 * | 1/2007 | Perry | G11C 15/04 365/49.17 |
| 2007/0211517 | A1 | 9/2007 | Burnett | |
| 2007/0247885 | A1 * | 10/2007 | Watanabe | G11C 15/04 365/49.17 |
| 2007/0274144 | A1 * | 11/2007 | Hanzawa | G11C 15/043 365/203 |
| 2014/0003160 | A1 | 1/2014 | Trivedi et al. | |
| 2014/0204687 | A1 | 7/2014 | Sinangil et al. | |
| 2014/0269018 | A1 | 9/2014 | Jin et al. | |
| 2015/0009751 | A1 | 1/2015 | Kulkarni et al. | |
| 2015/0085568 | A1 | 3/2015 | Gulati et al. | |
| 2015/0091609 | A1 | 4/2015 | Srinath et al. | |

OTHER PUBLICATIONS

Chik R.Y.V., "Design Techniques for Low-Voltage BiCMOS Digital Circuits," Dissertation, 1996, 127 Pages.

Diaz, C. H., et al., "32nnn Gate-First High-k/Metal-Gate Technology for High Performance Low Power Applications," IEDM 2008, IEEE International Electron Devices Meeting, San Francisco, CA, 2008, pp. 1-4.

Fung, Samuel K. H., et al., "65 nm CMOS High Speed, General Purpose and Low Power Transistor Technology for High Volume Foundry Application," 2004 Symposium on VLSI Technology, Digest of Technical Papers, IEEE, Jun. 15-17, 2004, pp. 92-93.

Jeong, J., et al., "A 16nm Configurable Pass-Gate Bit-Cell Register File for Quantifying the VMIN Advantage of PFET versus NFET Pass-Gate Bit Cells," Proceedings of the IEEE Custom Integrated Circuits Conference (CICC), Sep. 2015, 4 pages.

Wu, C. C., et al., "A 90-nm CMOS Device Technology with High-speed, General-purpose, and Low-leakage Transistors for System on Chip Applications," IEDM '02, International Electron Devices Meeting, San Francisco, CA, Dec. 8-11, 2002, pp. 65-68.

Wu, C.C., et al., "High Performance 22/20nm FinFET CMOS Devices with Advanced High-K/Metal Gate Scheme," 2010 IEEE International Electron Devices Meeting (IEDM), San Francisco, CA, Dec. 6-8, 2010, pp. 27.1.1-27.1.4.

Wu, S-Y., et al., "A 16nm FinFET CMOS Technology for Mobile SoC and Computing Applications," 2013 IEEE International Electron Devices Meeting (IEDM), Dec. 9-11, 2013, Washington, DC, pp. 9.1.1-9.1.4.

Young, K. K., et al., "A 0.13 μm CMOS Technology with 193 nm Lithography and Cu/Low-k for High Performance Applications," 2000 International Electron Devices Meeting, IEDM Technical Digest, Dec. 10-13, 2000, pp. 23.2.1-23.2.4.

Zhu Z., "High Performance CMOS Digital Circuit Design," Dissertation, May 1998, 142 pages.

Invitation to Pay Additional Fees and Partial Search Report for PCT/US2016/016112, mailed May 11, 2016, 7 pages.

International Search Report and Written Opinion for PCT/US2016/016112, dated Sep. 13, 2016, 18 pages.

Second Written Opinion for PCT/US2016/016112, dated Feb. 22, 2017, 9 pages.

Third Written Opinion for PCT/US2016/016112, dated May 22, 2017, 9 pages.

International Preliminary Report on Patentability for PCT/US2016/016112, dated Sep. 12, 2017, 33 pages.

* cited by examiner

US 9,947,406 B2

DYNAMIC TAG COMPARE CIRCUITS EMPLOYING P-TYPE FIELD-EFFECT TRANSISTOR (PFET)-DOMINANT EVALUATION CIRCUITS FOR REDUCED EVALUATION TIME, AND RELATED SYSTEMS AND METHODS

PRIORITY APPLICATION

The present application claims priority under 35 U.S.C. § 119(e) to U.S. Provisional Patent Application Ser. No. 62/119,769 filed on Feb. 23, 2015 and entitled "P-TYPE FIELD-EFFECT TRANSISTOR (PFET)-DOMINANT DYNAMIC LOGIC CIRCUITS, AND RELATED SYSTEMS AND METHODS," which is incorporated herein by reference in its entirety.

BACKGROUND

I. Field of the Disclosure

The technology of the disclosure relates generally to dynamic logic circuits clocked by a clock signal, and more particularly to increasing speed performance of dynamic logic circuits.

II. Background

Dynamic logic circuits provide significant performance advantages in comparison to static logic circuits. Dynamic logic circuits reduce transistor gate capacitance during a logic evaluation. In this regard, as an example, a conventional processor contains many instances of dynamic logic circuits throughout its design in performance-critical logic to provide faster evaluation of logic evaluations.

In this regard, FIG. 1 is a circuit diagram of a NAND dynamic logic circuit 100 as an example of a dynamic logic circuit. The NAND dynamic logic circuit 100 pre-charges a dynamic node (DYN) 102 voltage in a pre-charge phase. The dynamic node (DYN) 102 is pre-charged to voltage Vdd with a P-type Field-Effect Transistor (PFET) 104 in a pre-charge circuit 106 when a clock signal (CLK) 108 is low to provide the voltage Vdd at the dynamic node (DYN) 102. This is because the PFET 104 passes a strong logical "1" or voltage Vdd so that the dynamic node (DYN) 102 is charged to voltage Vdd, as opposed to only a threshold voltage Vt below voltage Vdd if employing an N-type FET (NFET) for example. The voltage Vdd at the dynamic node (DYN) 102 transitions an output node (OUT) 110 to ground voltage (GND) because of an inverter 112.

Then, once the clock signal 108 transitions high in an evaluation phase, the PFET 104 in the pre-charge circuit 106 becomes inactive. The NAND dynamic logic circuit 100 evaluates the logic with N-type FETs (NFETs) 114(1), 114(2) in a pull-down logic circuit 116, based on inputs A and B, respectively, so that the evaluation phase will evaluate quickly. If the states of inputs A and B are input A=voltage Vdd and input B=voltage Vdd, the NFETs 114(1), 114(2) in the pull-down logic circuit 116 will be active. This causes the series-connected NFETs 114(1), 114(2), 118 in the evaluation phase to pull the dynamic node (DYN) 102 to ground voltage (GND), resulting in the output node (OUT) 110 transitioning to voltage Vdd. Otherwise, if input A=ground voltage GND or input B=ground voltage GND, the dynamic node (DYN) 102 voltage remains at voltage Vdd during the evaluation phase due to a stacked PFET keeper circuit 120 retaining the dynamic node (DYN) 102 at voltage Vdd. Consequently, the output node (OUT) 110 remains at ground voltage (GND) because of the inverter 112, respectively.

SUMMARY OF THE DISCLOSURE

Aspects of the disclosure involve dynamic tag compare circuits employing P-type Field-Effect Transistor (PFET)-dominant evaluation circuits for reduced evaluation time. Related systems and methods are also disclosed. Dynamic logic circuits may be provided in a processor to perform logic operations as one example. Dynamic logic circuits are usually faster than static logic circuit counterparts, because dynamic logic circuits reduce transistor gate capacitance during a logic evaluation. Since circuit delay is directly proportional to output capacitance, the delay of a dynamic logic circuit is conventionally lower than a static logic circuit. It has been observed that as node technology is scaled down in size, PFET drive current (i.e., drive strength) exceeds N-type FET (NFET) drive current for like-dimensioned FETs. This is due to the introduction of strained silicon in FET fabrication to reduce the effective mass of charge carriers.

In this regard, in exemplary aspects disclosed herein, dynamic tag compare circuits are provided that employ PFET-dominant evaluation circuits to decrease evaluation times, and thus increase circuit performance. A dynamic tag compare circuit may be used for or provided as part of a searchable memory, such as a register file or content-addressable memory (CAM), as non-limiting examples. The dynamic tag compare circuit includes one or more PFET-dominant evaluation circuits comprised of one or more PFETs used as logic to perform a compare logic function. The one or more PFET-dominant evaluation circuits are configured to receive and compare input search data to input store data (e.g., a tag address or tag data) contained in a searchable memory to determine if the input search data is contained in the searchable memory. The PFET-dominant evaluation circuits are configured to control the voltage/value on a dynamic node in the dynamic tag compare circuit based on the evaluation of whether the received input search data is contained in the searchable memory. The dynamic tag compare circuit may provide or further condition the voltage/value on the dynamic node to provide a match output indicating if the received input search data is contained in the searchable memory.

In this regard, in one example, because a PFET(s) in the PFET-dominant evaluation circuits are capable of passing a strong logic '1' voltage/value (i.e., the supply voltage), an NFET-dominant pre-discharge circuit is provided in the dynamic tag compare circuit. The NFET-dominant pre-discharge circuit is provided to fully discharge the dynamic node in the dynamic tag compare circuit to a logical '0' voltage/value (e.g., a ground voltage), because an NFET is capable of passing a strong logic '0' voltage/value. Thus, if a PFET-dominant evaluation circuit evaluates that received input search data is contained in the searchable memory, the PFET-dominant evaluation circuit is configured to charge the dynamic node to a logical '1' voltage/value.

In this regard, in one exemplary aspect, a dynamic tag compare circuit is provided. The dynamic tag compare circuit comprises a pre-discharge circuit coupled to an evaluation node. The pre-discharge circuit is configured to pre-discharge the evaluation node during a pre-discharge phase. The dynamic tag compare circuit comprises a PFET-dominant evaluation circuit comprising at least one search data input configured to receive at least one input search data, and at least one stored data input configured to receive at least one input stored data. The PFET-dominant evaluation circuit is configured to charge the evaluation node in an evaluation phase based on a comparison of the least one input search data to the at least one input stored data.

In another exemplary aspect, a dynamic tag compare circuit is provided. The dynamic tag compare circuit comprises a means for pre-discharging an evaluation node during a pre-discharge phase. The dynamic tag compare circuit also comprises a means for comparing at least one input search data to at least one input stored data. The means for comparing comprises a means for receiving at least one input search data, a means for receiving at least one input stored data, and a means for charging the evaluation node in an evaluation phase based on a comparison of the at least one input search data to the at least one input stored data.

In another exemplary aspect, a method of performing a dynamic logic comparison of search data to stored data in a searchable memory is provided. The method comprises pre-discharging an evaluation node during a pre-discharge phase. The method also comprises receiving at least one input search data on at least one search data input in a PFET-dominant evaluation circuit. The method also comprises receiving at least one input stored data on at least one stored data input in the PFET-dominant evaluation circuit. The method also comprises comparing the received at least one input search data to the received at least one input stored data in the PFET-dominant evaluation circuit. The method also comprises charging the evaluation node in an evaluation phase based on the comparison of the received at least one input search data to the received at least one input stored data.

In another exemplary aspect, a memory system is provided. The memory system comprises a memory comprising a plurality of bit cells each configured to store a data bit and pass the data bit to at least one bit line in response to a search operation. The memory system also comprises a PFET-dominant tag compare circuit. The PFET-dominant tag compare circuit comprises at least one pre-discharge circuit coupled to an evaluation node, the at least one pre-discharge circuit configured to pre-discharge the evaluation node during a pre-discharge phase. The PFET-dominant tag compare circuit also comprises a plurality of PFET-dominant evaluation circuits. Each PFET-dominant evaluation circuit among the plurality of PFET-dominant evaluation circuits comprises at least one search data input configured to receive at least one input search bit, at least one stored data input configured to receive at least one input stored bit from at least one bit line of a bit cell among the plurality of bit cells, and comparing the at least one input search bit to the at least one input stored bit. The plurality of PFET-dominant evaluation circuits are each configured to charge the evaluation node in an evaluation phase based on the comparison of the at least one input search bit to the at least one input stored bit.

DETAILED DESCRIPTION

Figure 1:
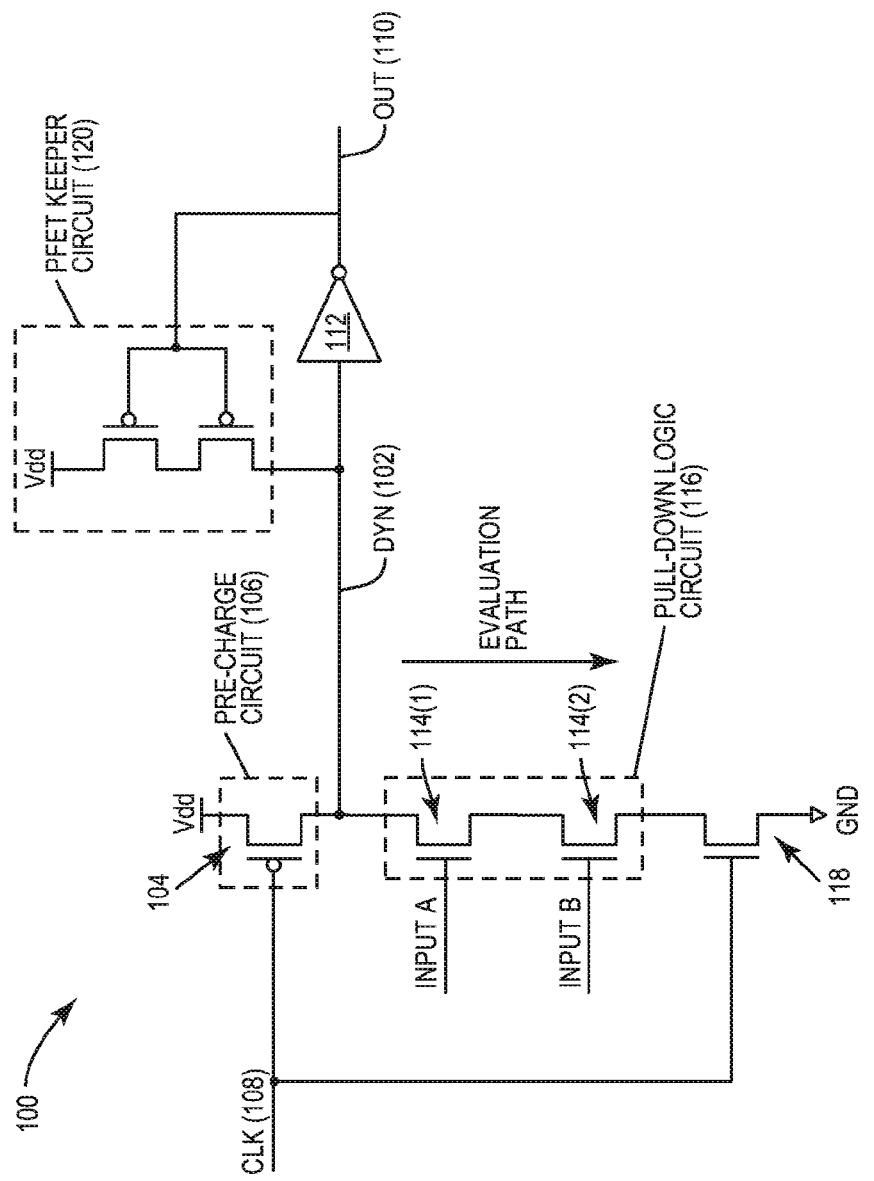
FIG. 1 is a circuit diagram of an exemplary NAND dynamic logic circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
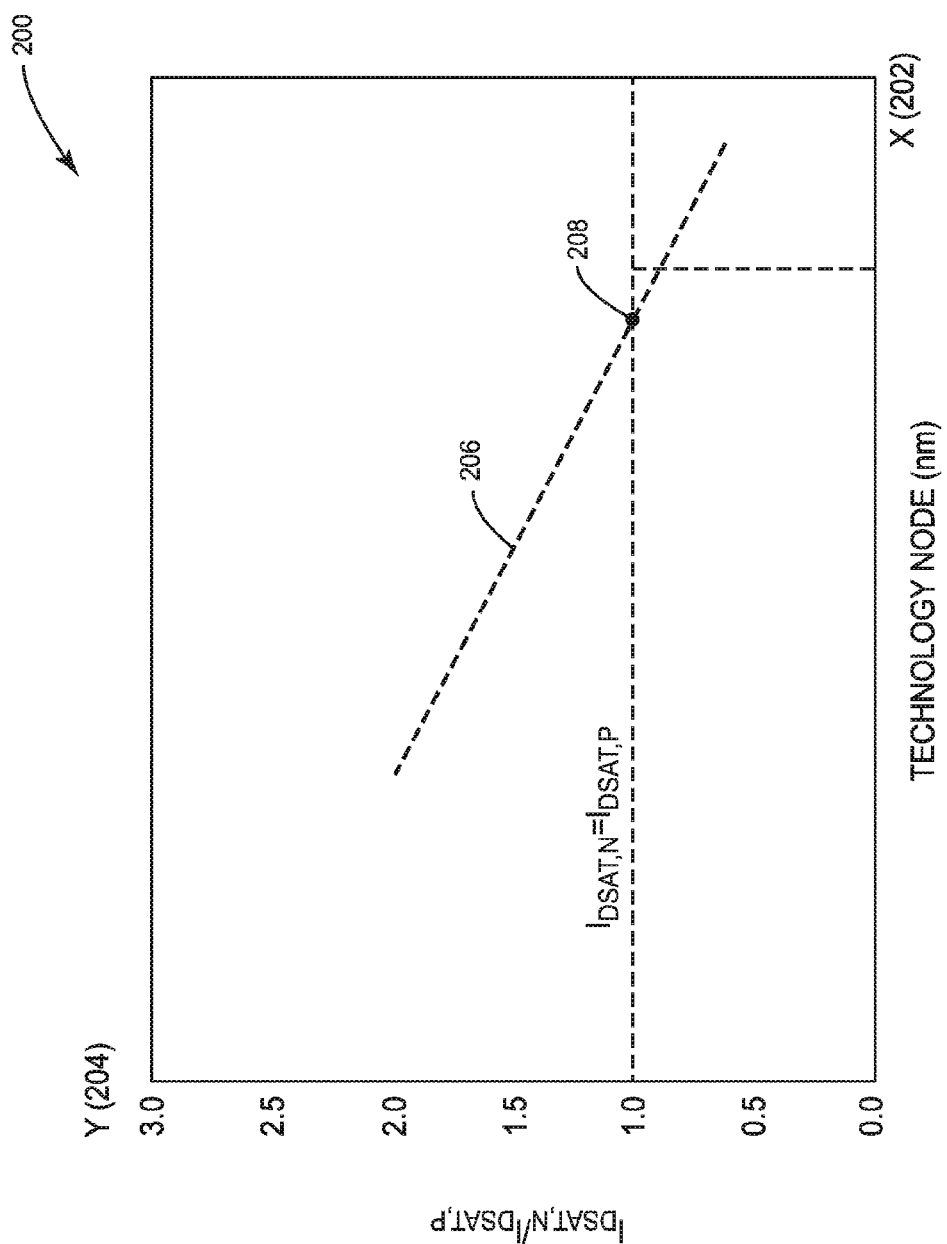
FIG. 2 is a graph illustrating relative saturation drain currents ($I_{DSAT}$) of N-type Field-Effect Transistor (NFET) and P-type FET (PFET) technology as a function of technology node size.

As shown in a graph 200 in FIG. 2, it has been observed that as node technology is scaled down in size, PFET drive current (i.e., drive strength) exceeds NFET drive current for like-dimensioned FETs. This is due to the introduction of strained silicon in FET fabrication to reduce the effective mass of charge carriers. As illustrated in FIG. 2, the technology node size in nanometers (nm) is provided on an X-axis 202. The ratio of the saturation drain current ($I_{DSAT,N}$) of an NFET to saturation drain current ($I_{DSAT,P}$) of a PFET is provided on a Y-axis 204. The ratio of $I_{DSAT,N}$ to $I_{DSAT,P}$ as a function of technology node size in nm is shown on a ratio line 206. As shown by the ratio line 206 in FIG. 2, a PFET drive strength increases as compared to a like-dimensioned NFET as the technology node size decreases. At point 208, the ratio line 206 crosses a ratio of 1.0 of NFET drive current to PFET drive strength. Thus in this example, the drive strength of the PFET is greater than the drive strength of a like-dimensioned NFET.

In this regard, dynamic logic circuits are one type of circuit that employ FETs for evaluation of logic conditions. As an example, dynamic logic circuits may be provided in a processor to perform logic operations. Dynamic logic circuits may be faster than static logic circuit counterparts, because dynamic logic circuits reduce transistor gate capacitance during a logic evaluation. Since circuit delay is directly proportional to output capacitance, the delay of a dynamic logic circuit is conventionally lower than static logic. It has been observed that as node technology is scaled down in size, PFET drive current (i.e., drive strength) exceeds NFET drive current for like-dimensioned FETs. This is due to the introduction of strained silicon in FET fabrication to reduce the effective mass of charge carriers thereby increasing the charge-carrier effective mobility. As shown in the saturation drive current ($I_{DSAT}$) equation below, an increase in the charge-carrier effective mobility results in an increase in saturation drive current ($I_{DSAT}$).

$$I_{DSAT} = \frac{1}{2} \mu C_{ox} W/L (V_{GS} - V_{TH})^2$$

where:

$I_{DSAT}$=saturation drive current,
'µ' is the charge-carrier effective mobility,
'W' is the gate width,
'L' is the gate length,
'$C_{ox}$' is the capacitance of the oxide layer;
'$V_{GS}$' is the gate-to-source voltage ($V_{GS}$), and
'$V_{TH}$' is the threshold voltage.

The strained silicon in FET fabrication has benefited the effective mobility for holes more than the effective mobility for electrons. For this reason, the PFET $I_{DSAT}$ has significantly improved relative to the NFET $I_{DSAT}$. Thus, based on this recognition, dynamic logic circuits can be provided that employ a PFET-dominant evaluation circuit(s) to decrease logic evaluation times, and thus increase circuit performance. PFET-dominant evaluation circuit(s) include one or more PFET circuits. The PFET circuit(s) are configured to evaluate logic conditions based on one or more data inputs. Thus, the PFET-dominant evaluation circuit(s) may decrease evaluation times in a dynamic logic circuit, and thus increase circuit performance based on the PFET circuit drive current (i.e., drive strength).

In examples discussed below, because a PFET(s) in a PFET-dominant evaluation circuit is capable of passing a strong logic '1' voltage/value, an NFET-dominant pre-discharge circuit may be provided in the dynamic logic circuit employing a PFET-dominant evaluation circuit(s). The NFET-dominant pre-discharge circuit is provided to discharge a dynamic node in the dynamic logic circuit to a logical '0' voltage/value, because an NFET is capable of passing a strong logic '0' voltage/value. Thus, a PFET-dominant evaluation circuit can be configured to charge the dynamic node to a logical '1' voltage/value by its ability to pass a strong logic '1' voltage/value based on the results of the evaluation.

Figure 3:
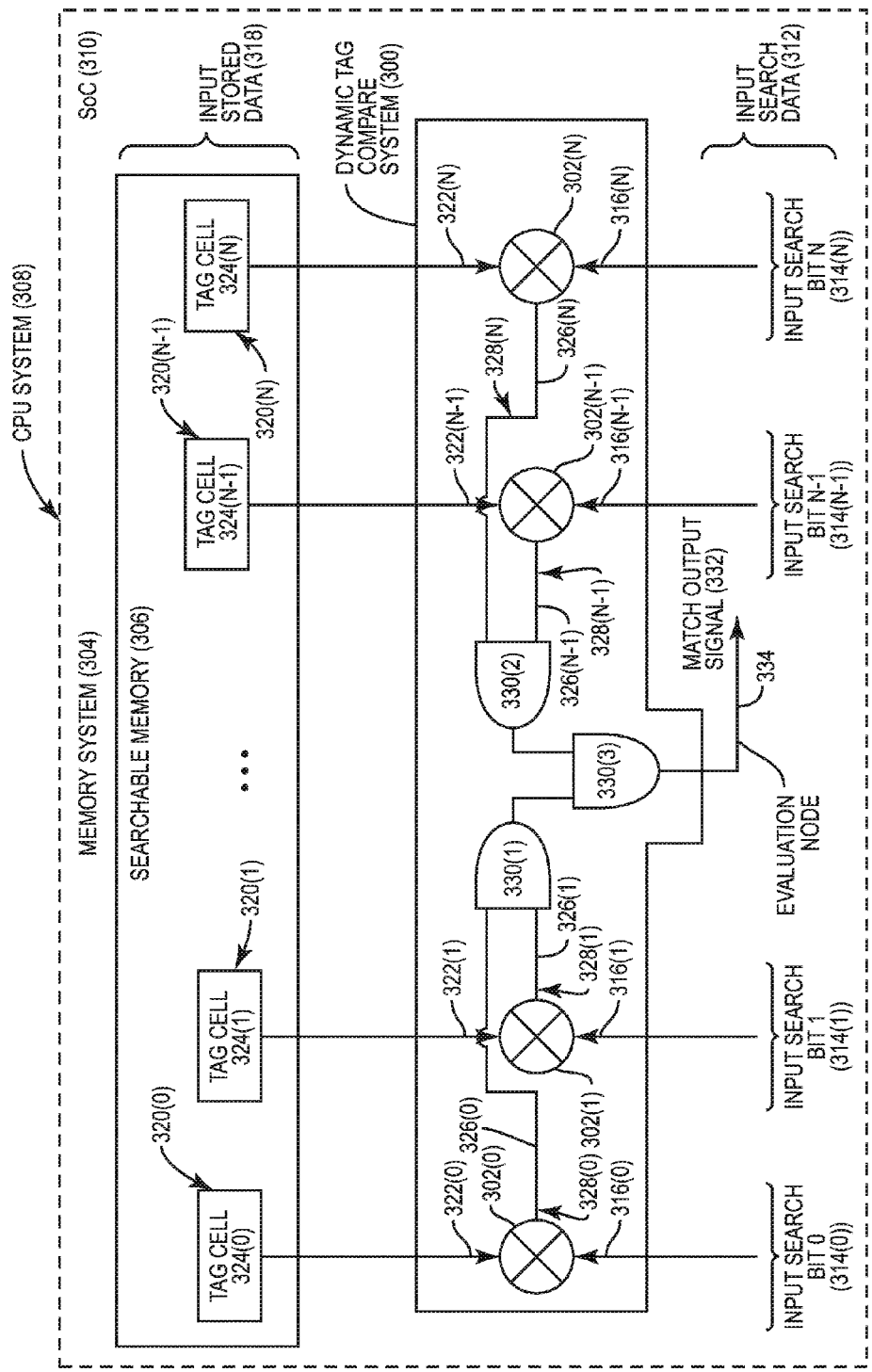
FIG. 3 is a block diagram of an exemplary memory system that includes a dynamic tag compare circuit that includes a plurality of PFET-dominant evaluation circuits configured to compare received input data to data stored in a searchable memory in the memory system.

In this regard, FIG. 3 is a block diagram of an exemplary dynamic tag compare system 300 that employs a plurality of dynamic tag compare circuits 302(0)-302(N) as a type of dynamic logic circuit. In this example, the dynamic tag compare system 300 is provided in a memory system 304 that includes a searchable memory 306. The memory system 304 may be provided in a central processing unit (CPU)-based system 308 or other processor, including a system-on-a-chip (SoC) 310 as a non-limiting example. For example, the searchable memory 306 may be a register file or a content-addressable memory (CAM) as non-limiting examples. N+1 dynamic tag compare circuits 302(0)-302(N) are provided in the dynamic tag compare system 300 so that input search data 312 of N+1 bit width, comprising N+1 input search bits 314(0)-314(N), can be received on respective search data inputs 316(0)-316(N). N+1 bits of input stored data 318 comprising input stored bits 320(0)-320(N) are received on respective stored data inputs 322(0)-322(N) of the dynamic tag compare circuits 302(0)-302(N). The input stored bits 320(0)-320(N) are stored in respective tag cells 324(0)-324(N) in the searchable memory 306. Note that although only one (1) of the tag cells 324(0)-324(N) are shown, the searchable memory 306 may contain multiple rows of the tag cells 324(0)-324(N). The dynamic tag compare circuits 302(0)-302(N) are configured to compare the respective input search bits 314(0)-314(N) to the input stored bits 320(0)-320(N) for a selected row of the tag cells 324(0)-324(N) on a bit-by-bit basis to determine if the input search data 312 is contained in the searchable memory 306.

With reference to FIG. 3, each of the dynamic tag compare circuits 302(0)-302(N) have a compare output 326(0)-326(N) that provides respective compare output signals 328(0)-328(N) from the dynamic tag compare circuits 302(0)-302(N) indicating if the respective input search bits 314(0)-314(N) matched the respective input stored bits 320(0)-320(N). The compare output signals 328(0)-328(N) are provided to additional logic in the form of AND gates 330(1)-330(3) in this example that are configured to evaluate if all the respective input search bits 314(0)-314(N) matched the respective input stored bits 320(0)-320(N). If all the respective input search bits 314(0)-314(N) match the respective input stored bits 320(0)-320(N) in this example, a match output signal 332 (e.g., a logical '1') is generated on a match output 334 indicating that the input search data 312 was contained in the searchable memory 306. The input search data 312 may be thought of as a "tag." If all the respective input search bits 314(0)-314(N) do not match the respective input stored bits 320(0)-320(N) in this example, the match output signal 332 (e.g., a logical '0') is generated on the match output 334, indicating that the input search data 312 was not contained in the searchable memory 306.

As will be discussed in more detail below with regard to FIGS. 4A and 4B, the dynamic tag compare circuits 302(0)-302(N) in the dynamic tag compare system 300 in FIG. 3 each employ a PFET-dominant evaluation circuit in this example. The PFET-dominant evaluation circuits are configured to perform an evaluation of a logic comparison between the respective input search bits 314(0)-314(N) and the respective input stored bits 320(0)-320(N) stored in the searchable memory 306. In this manner, as node technology is scaled down in size, the PFET drive current (i.e., drive strength) in the PFET-dominant evaluation circuits in the dynamic tag compare circuits 302(0)-302(N) will allow the PFET-dominant evaluation circuits to perform the comparison logic function faster than a comparable NFET-based evaluation circuit for like-dimensioned FETs.

Figure 4A:
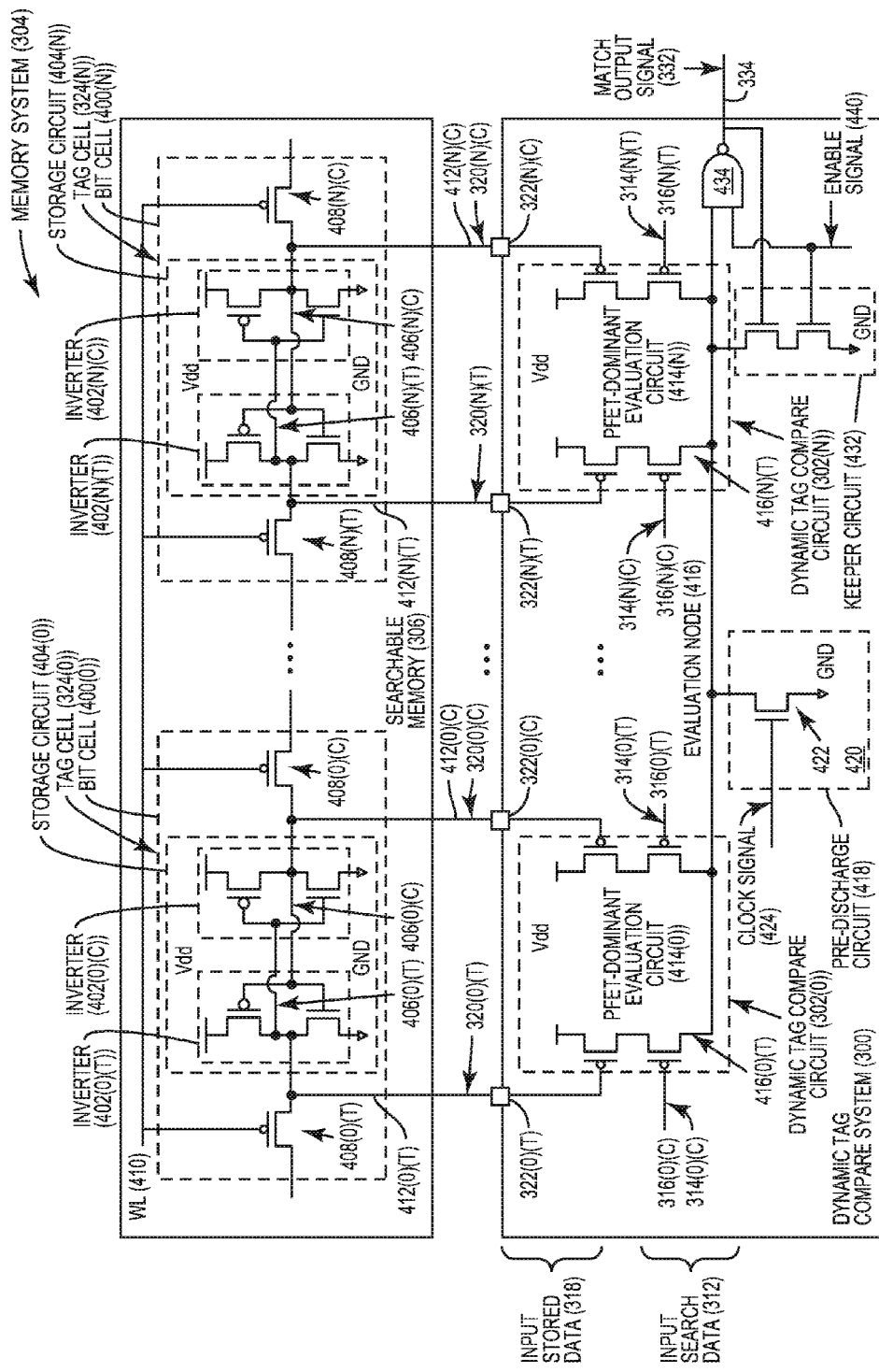
FIG. 4A illustrates more exemplary detail of the memory system that includes the dynamic tag compare circuit in FIG. 4, including additional exemplary detail of the PFET-dominant evaluation circuits provided therein.
Figure 4B:
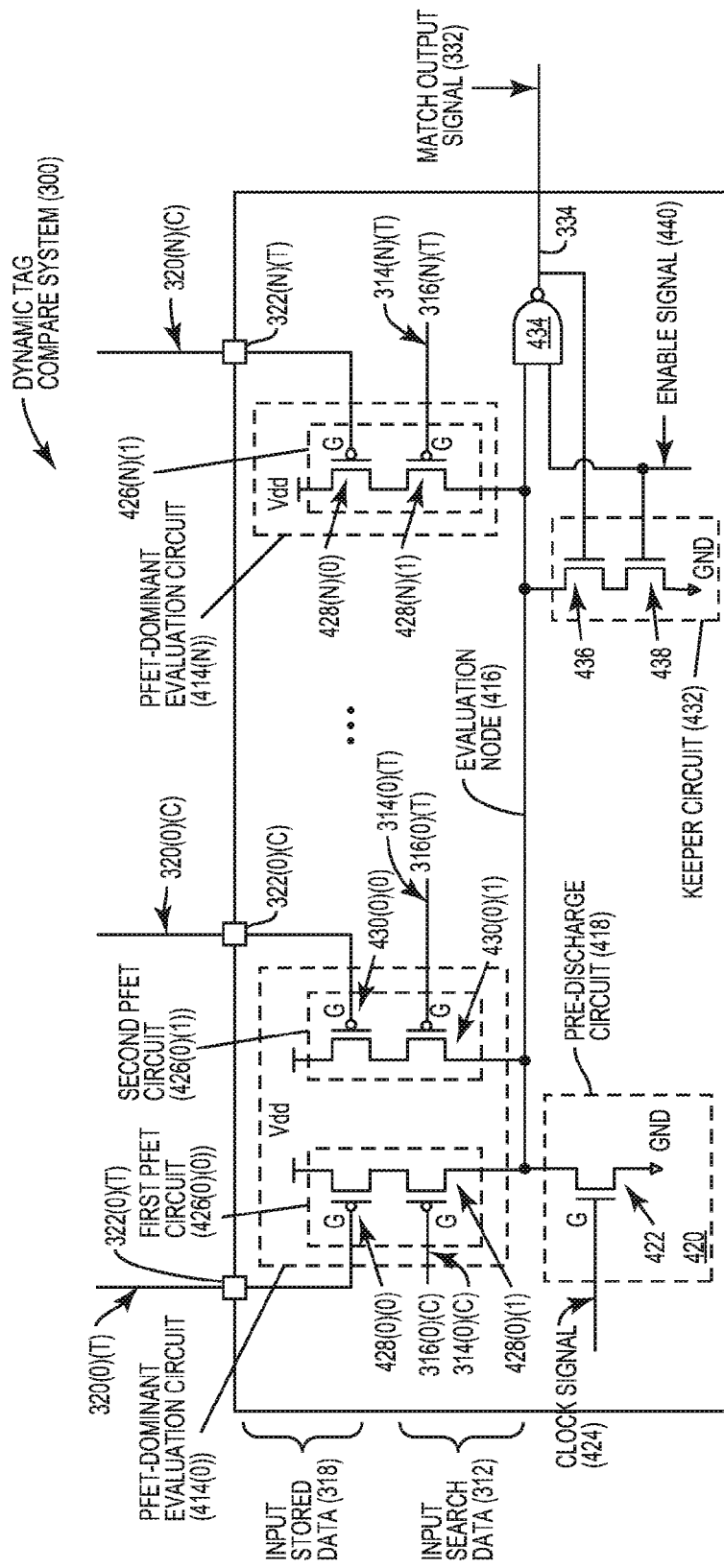
FIG. 4B illustrates a detailed view of the dynamic tag compare circuit in the memory system in FIG. 4A.

In this regard, FIGS. 4A and 4B illustrate more exemplary detail of the memory system 304 in FIG. 3 to further illustrate in more detail the dynamic tag compare circuits 302(0)-302(N) and PFET-dominant evaluation circuits contained therein. FIG. 4A illustrates more exemplary detail of the memory system 304 in FIG. 3. FIG. 4B is a detailed diagram of the dynamic tag compare circuits 302(0)-302(N) in the memory system 304 including the PFET-dominant evaluation circuits provided therein to evaluate a comparison of a respective input search bit 314(0)-314(N) with a respective input stored bit 320(0)-320(N). FIGS. 4A and 4B will be discussed in conjunction with each other.

As shown in FIG. 4A, more exemplary detail of a row of tag cells 324(0)-324(N) provided in the searchable memory 306 is shown. In this example, the tag cells 324(0)-324(N) are provided in the form of static random access memory (SRAM) bit cells 400(0)-400(N), also referred to as "bit cells 400(0)-400(N)." Using bit cell 400(0) as an example, as a representative of the other bit cells 400(1)-400(N), bit cell 400(0) is provided in a six (6) transistor (6-T) architecture in this example, as a non-limiting example. Two cross-coupled inverters 402(0)(T), 402(0)(C) are provided in a storage circuit 404 in the bit cell 400(0) to store a true stored bit 406(0)(T) and complement stored bit 406(0)(C). This allows for differential sensing of stored data in the bit cell 400(0) to provide for greater accuracy in a read operation. Two (2) access transistors 408(0)(T), 408(0)(C) are also provided in the bit cell 400(0), which are gate-activated by a word line (WL) 410 to select a desired row of bit cells 400(0)-400(N) for read and write operations. In this present example of the dynamic tag compare system 300, a read operation is performed on the bit cells 400(0)-400(N). The access transistors 408(0)(T), 408(0)(C) are configured to provide the true stored bit 406(0)(T) and complement stored bit 406(0)(C) to a respective true bit line 412(0)(T) and complement bit line 412(0)(C) to provide the true stored bit 406(0)(T) and complement stored bit 406(0)(C) for each bit cell 400(0)-400(N) to a respective dynamic tag compare circuit 302(0)-302(N).

Note that the access transistors 408(0)(T)-408(N)(T), 408(0)(C)-408(N)(C) in the bit cells 400(0)-400(N) in FIG. 4A are provided as respective PFETs in this example, which may also provide for faster read operations in the bit cells 400(0)-400(N), but such is not required. The access transistors 408(0)(T)-408(N)(T), 408(0)(C)-408(N)(C) in the bit cells 400(0)-400(N) could be NFETs as another example.

With continuing reference to FIG. 4A, the true stored bits 406(0)(T)-406(N)(T) for each bit cell 400(0)-400(N) in the searchable memory 306 are provided to respective true stored data inputs 322(0)(T)-322(N)(T) as the true input stored bits 320(0)(T)-320(N)(T) in the dynamic tag compare circuits 302(0)-302(N). The complement stored bits 406(0)(C)-406(N)(C) for each bit cell 400(0)-400(N) in the searchable memory 306 are provided to respective complement stored data inputs 322(0)(C)-322(N)(C) as the complement input stored bits 320(0)(C)-320(N)(C) in the dynamic tag compare circuits 302(0)-302(N). The true input search bits 314(0)(T)-314(N)(T) and the complement input search bits 314(0)(C)-314(N)(C) are provided to respective true search data inputs 316(0)(T)-316(N)(T) and complement search data inputs 316(0)(C)-316(N)(C), respectively, of the dynamic tag compare circuits 302(0)-302(N). Each dynamic tag compare circuit 302(0)-302(N) contains a PFET-dominant evaluation circuit 414(0)-414(N) each coupled to an evaluation node 416. The PFET-dominant evaluation circuits 414(0)-414(N) are each configured to evaluate a compare logic operation between the true input stored bits 320(0)(T)-320(N)(T) from the searchable memory 306 and the respective complement input search bits 314(0)(C)-314(N)(C). The PFET-dominant evaluation circuits 414(0)-414(N) are also configured to evaluate a compare logic operation between the complement input stored bits 320(0)(C)-320(N)(C) from the searchable memory 306 and the respective true input search bits 314(0)(T)-314(N)(T). As will be discussed in more detail below, based on the respective evaluations, the PFET-dominant evaluation circuits 414(0)-414(N) are each configured to charge the evaluation node 416 in an evaluation phase in this example if a mismatch exists between respective true and complement stored and search input bits. The PFET-dominant evaluation circuits 414(0)-414(N) are able to pass a strong logic '1' voltage/value based on the results of the evaluation.

With continuing reference to FIG. 4A, before the PFET-dominant evaluation circuits 414(0)-414(N) are each configured to charge the evaluation node 416 to perform their evaluation in the evaluation phase, the dynamic tag compare system 300 pre-discharges the evaluation node 416 in a pre-discharge phase. In this regard, the dynamic tag compare system 300 in FIG. 4A includes a pre-discharge circuit 418. The pre-discharge circuit 418 is coupled between the evaluation node 416 and a ground node (GND). In this example, the pre-discharge circuit 418 is comprised of an NFET-dominant pre-discharge circuit 420 comprised of an NFET 422. The NFET 422 is capable of passing a strong logic '0' voltage/value to the evaluation node 416 during the pre-discharge phase. The pre-discharge circuit 418 is configured to be activated to pre-discharge the evaluation node 416 to a voltage of the ground node (GND) (e.g., logical '0' in this example) based on a clock signal 424 activating the NFET 422 in the pre-discharge phase. Thus, because the PFET-dominant evaluation circuits 414(0)-414(N) are configured to charge the evaluation node 416 in response to a mismatch between an input search bit 314 and an input stored bit 320, the evaluation node 416 remaining pre-discharged to the voltage of the ground node (GND) is an indication that the true input search bits 314(0)(T)-314(N)(T) match the true input stored bits 320(0)(T)-320(N)(T), and the complement input search bits 314(0)(C)-314(N)(C) match the complement input stored bits 320(0)(C)-320(N)(C).

To further explain the evaluate operation of the PFET-dominant evaluation circuits 414(0)-414(N) in the respective dynamic tag compare circuits 302(0)-302(N), FIG. 4B is provided. FIG. 4B includes a detailed view of the dynamic tag compare circuit 302(0) as an example to further explain the evaluation phase of the PFET-dominant evaluation circuit 414(0). The explanation of the PFET-dominant evaluation circuit 414(0) is equally applicable to the other PFET-dominant evaluation circuits 414(1)-414(N) in the dynamic tag compare circuits 302(1)-302(N).

In this regard, with reference to FIG. 4B, the PFET-dominant evaluation circuit 414(0) is comprised of a first PFET circuit 426(0)(0) and a second PFET circuit 426(0)(1). The first PFET circuit 426(0)(0) includes a first PFET 428(0)(0) and a second PFET 428(0)(1). A gate (G) of the first PFET 428(0)(0) is the true stored data input 322(0)(T) configured to receive the true input stored bit 320(0)(T). A gate (G) of the second PFET 428(0)(1) is the complement search data input 316(0)(C) configured to receive the complement input search bit 314(0)(C). Similarly, the second PFET circuit 426(0)(1) in the PFET-dominant evaluation circuit 414(0) includes a first PFET 430(0)(0) and a second PEET 430(0)(1). A gate (G) of the first PFET 430(0)(0) is the complement stored data input 322(0)(C) configured to receive the complement input stored bit 320(0)(C). A gate (G) of the second PFET 430(0)(1) is the true search data input 316(0)(T) configured to receive the true input search bit 314(0)(T). In this manner, the PFET-dominant evaluation circuit 414(0) is configured to compare the true input stored bit 320(0)(T) to the complement input search bit 314(0)(C). The PFET-dominant evaluation circuit 414(0) is also configured to compare the complement input stored bit 320(0)(C) to the true input search bit 314(0)(T). A mismatch should exist between a true input stored bit 320(T) and a complement input search bit 314(C) and vice versa, for the input stored data 318 stored in the searchable memory 306 to match the input search data 312. For example, if a true input stored bit 320(0)(T) is logical '0' and a complement input search bit 314(0)(C) is also logical '0', the first and second PFETs 428(0)(0), 428(0)(1) will be activated to cause the first PFET circuit 426(0)(0) to charge the evaluation node 416 to voltage Vdd, meaning a tag bit mismatch. However, if a true input stored bit 320(0)(T) is logical '0' and a complement input search bit 314(0)(C) is logical '1', the second PFET 428(0)(1) will be not activated such that the first PFET circuit 426(0)(0) will not charge the evaluation node 416 to voltage Vdd, meaning a tag bit match. Thus, if the evaluation node 416 is not charged by any of the PFET-dominant evaluation circuits 414(0)-414(N) in the dynamic tag compare system 300, a tag match occurs, meaning that the input search data 312 matches the input stored data 318 in the searchable memory 306 for the selected row of tag cells 324(0)-324(N).

Note that with continuing reference to FIG. 4B, even the true input stored bit 320(0)(T) and the complement input search bit 314(0)(C) were logical '1,' the evaluation node 416 would be charged to indicate a tag mismatch. The first and second PFETs 428(0)(0), 428(0)(1) in the first PFET circuit 426(0)(0) would not be activated to charge the evaluation node 416 because of the true input stored bit 320(0)(T) and the complement input search bit 314(0)(C) being logical '1' values. However, this means that the complement input stored bit 320(0)(C) and the true input search bit 314(0)(T) would be logical '0.' Thus, this mismatch would cause the first and second PFETs 430(0)(0), 430(0)(1) in the second PFET circuit 426(0)(1) to be activated to cause the second PFET circuit 426(0)(1) in the PFET-dominant evaluation circuit 414(0) to charge the evaluation node 416 to voltage Vdd indicating the tag mismatch.

To provide the match output signal 332 indicating whether the input search data 312 matches the input stored data 318 in the searchable memory 306 for the selected row of tag cells 324(0)-324(N), the dynamic tag compare system 300 also includes a keeper circuit 432 as shown in FIG. 4A and in more detail in FIG. 4B. The keeper circuit 432 is configured to maintain or "keep" the previously pre-discharged voltage of the ground node (GND) on the evaluation node 416 if there was a match between the true input search bits 314(0)(T)-314(N)(T) and true input stored bits 320(0)(T)-320(N)(T), or a match between the complement input search bits 314(0)(C)-314(N)(C) and the complement input stored bits 320(0)(C)-320(N)(C). As discussed above, if however there is a mismatch between the true input search bits 314(0)(T)-314(N)(T) and true input stored bits 320(0)(T)-320(N)(T), or a mismatch between the complement input search bits 314(0)(C)-314(N)(C) and the complement input stored bits 320(0)(C)-320(N)(C), the PFET-dominant evaluation circuits 414(0)-414(N) are configured to charge the evaluation node 416 to voltage Vdd, indicating the mismatch. Thus, if no mismatch is determined, the evaluation node 416 that was pre-discharged to the ground node (GND) (i.e., logical '0') during the pre-discharge phase remains pre-discharged. This will cause a NAND gate 434 to activate NFET 436 in the keeper circuit 432, as shown in FIG. 4B, to be activated to continue to pull-down the evaluation node 416 to ground in response to an enable signal 440 activating NFET 438. An output of the NAND gate 434 provides the match output 334 to provide the match output signal 332 indicating if the input search bits 314 matched the input stored bits 320. The match output signal 332 being logical '1' indicates a match in this example.

Figure 5:
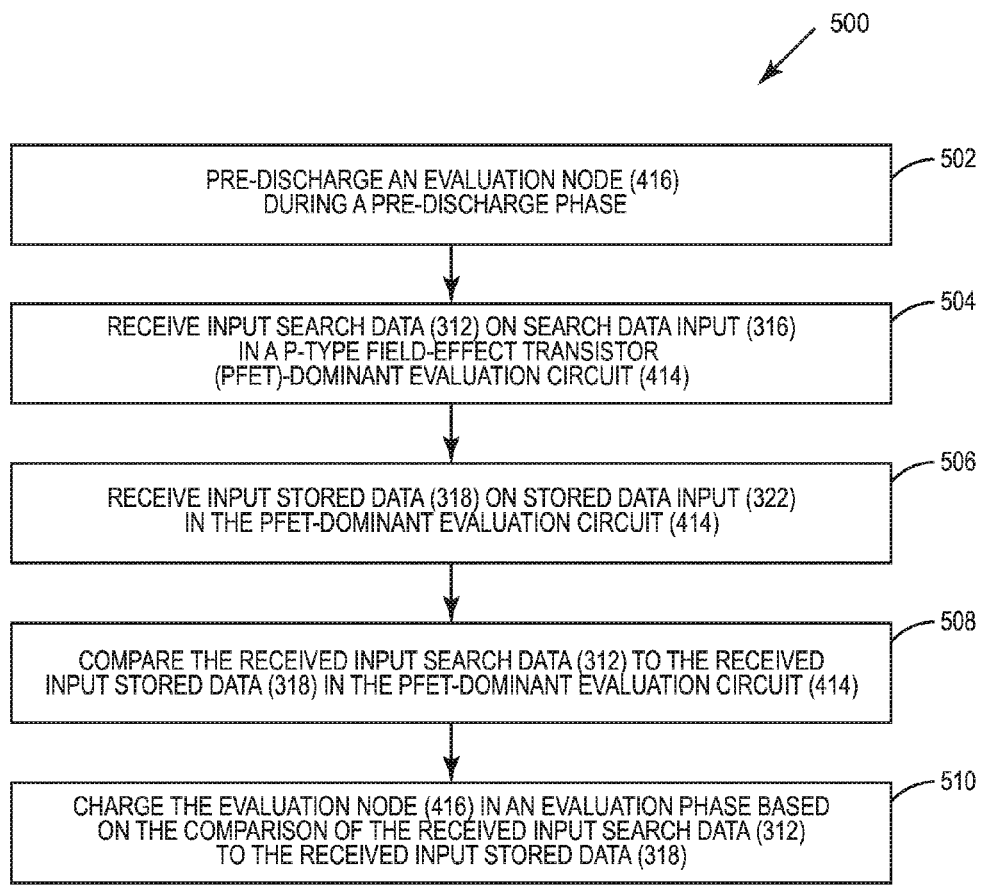
FIG. 5 is a flowchart illustrating an exemplary process of the dynamic tag compare circuit in the memory system in FIGS. 4A and 4B performing a compare logic function in a PFET-dominant evaluation circuit to compare received input search data to input stored data in the searchable memory to determine if the received input search data is contained in the searchable memory.

FIG. 5 is a flowchart illustrating an exemplary process 500 of the dynamic tag compare circuit 302(0)-302(N) in FIGS. 4A and 4B performing a compare logic function by employing the PFET-dominant evaluation circuit 414(0)-414(N) to compare the received input search data 312 (e.g., true input search bits 314(0)(T)-314(N)(T) and complement input search bits 314(0)(C)-314(N)(C)) to the received input stored data 318 (e.g., true input stored bits 320(0)(T)-320(N)(T) and complement input stored bits 320(0)(C)-320(N)(C)) in the searchable memory 306 to determine if the received input search data 312 is contained in the searchable memory 306. In this regard, the process 500 first involves the pre-discharge circuit 418 pre-discharging the evaluation node 416 during a pre-discharge phase (block 502). The PFET-dominant evaluation circuits 414(0)-414(N) receive the input search data 312 on the search data inputs 316 (block 504). The PFET-dominant evaluation circuits 414(0)-414(N) also receive the input stored data 318 on the stored data inputs 322 (block 506). The PFET-dominant evaluation circuits 414(0)-414(N) compare the received input search data 312 to the received input stored data 318 (block 508). The PFET-dominant evaluation circuits 414(0)-414(N) charge the evaluation node 416 in an evaluation phase based on the comparison of the received input search data 312 to the received input stored data 318. As previously discussed above, in the example of the dynamic tag compare system 300 in FIGS. 4A and 4B, the PFET-dominant evaluation circuits 414(0)-414(N) charge the evaluation node 416 if there is a mismatch between the received input search data 312 and the received input stored data 318 (block 510). Note however that PFET-dominant evaluation circuits could be provided in the dynamic tag compare system 300 that are configured to charge the evaluation node 416 if there is a match between the received input search data 312 and the received input stored data 318.

The dynamic tag compare circuits employing PFET-dominant evaluation circuits according to aspects disclosed herein, may be provided in or integrated into in any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
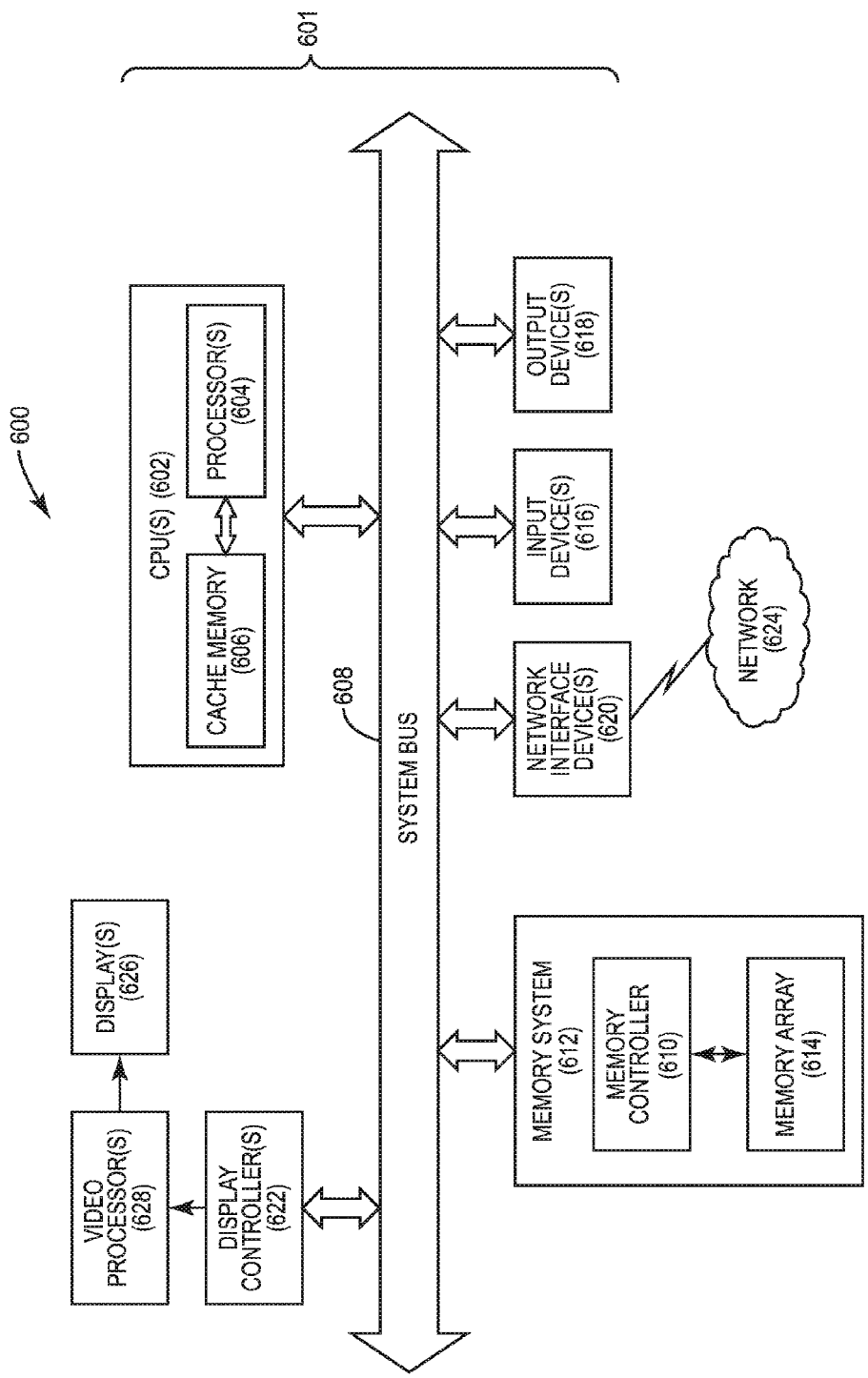
FIG. 6 is a block diagram of an exemplary processor-based system that can include a dynamic tag compare circuit employing a PFET-dominant evaluation circuit(s), according to any of the aspects disclosed herein.

In this regard, FIG. 6 illustrates an example of a processor-based system 600 that can employ dynamic logic circuits 601 according to any of the particular aspects discussed above. In this example, the processor-based system 600 includes one or more central processing units (CPUs) 602, each including one or more processors 604. As a non-limiting example, the dynamic logic circuits 601 disclosed herein may be included in a CPU 602 for a translation look-aside buffer (TLB) for performing tag comparisons for virtual address to physical address translations. The CPU(s) 602 may have cache memory 606 coupled to the processor(s) 604 for rapid access to temporarily stored data. As a non-limiting example, the dynamic logic circuits 601 disclosed herein may be included in the cache memory 606 for cache entry tag comparison operations. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 in a memory system 612 as an example of a slave device. Although not illustrated in FIG. 6, multiple system buses 608 could be provided, wherein each system bus 608 constitutes a different fabric. In this example, the memory controller 610 is configured to provide memory access requests to a memory array 614 in the memory system 612. As a non-limiting example, the dynamic logic circuits 601 disclosed herein may be included in the memory system 612, such as the memory controller 610, for performing look-ups of data in the memory array 614.

Other devices can be connected to the system bus 608. As illustrated in FIG. 6, these devices can include the memory system 612, one or more input devices 616, one or more output devices 618, one or more network interface devices 620, and one or more display controllers 622, as examples. The input device(s) 616 can include any type of input device, including but not limited to input keys, switches, voice processors, etc. The output device(s) 618 can include any type of output device, including but not limited to audio, video, other visual indicators, etc. The network interface device(s) 620 can be any devices configured to allow exchange of data to and from a network 624. The network 624 can be any type of network, including but not limited to a wired or wireless network, a private or public network, a local area network (LAN), a wide local area network (WLAN), and the Internet. The network interface device(s) 620 can be configured to support any type of communications protocol desired.

The CPU(s) 602 may also be configured to access the display controller(s) 622 over the system bus 608 to control information sent to one or more displays 626. The display controller(s) 622 sends information to the display(s) 626 to be displayed via one or more video processors 628, which process the information to be displayed into a format suitable for the display(s) 626. The display(s) 626 can include any type of display, including but not limited to a cathode ray tube (CRT), a liquid crystal display (LCD), a plasma display, etc.

Note that the use of PFET and NFET in this disclosure can include PMOSFETs and NMOSFETs that are metal oxide semiconductors (MOSs). The PFETs and NFETs discussed herein can include other types of oxide layers other than metal. Also note that any of the assist circuits disclosed herein can be provided for either or both of the bit line and bit line complement of the bit cells disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A dynamic tag compare system, comprising:
   an N-type Field-Effect Transistor (FET) (NFET)-dominant pre-discharge circuit coupled to an evaluation node, the NFET-dominant pre-discharge circuit configured to pre-discharge the evaluation node during a pre-discharge phase;
   a first P-type FET (PFET)-dominant evaluation circuit coupled to a first memory bit cell in a memory, the first PFET-dominant evaluation circuit comprising at least one first PFET coupled to the evaluation node and at least one first search data input configured to receive at least one first input search data, and at least one first stored data input configured to receive at least one first input stored data in the first memory bit cell; and
   a second PFET-dominant evaluation circuit coupled to a second memory bit cell in the memory, the second PFET-dominant evaluation circuit comprising at least one second PFET coupled to the evaluation node and at least one second search data input configured to receive at least one second input search data, and at least one second stored data input configured to receive at least one second input stored data in the second memory bit cell;

the first PFET-dominant evaluation circuit configured to charge the evaluation node in an evaluation phase based on a comparison of the least one first input search data to the at least one first input stored data in the first memory bit cell; and the second PFET-dominant evaluation circuit configured to charge the evaluation node in the evaluation phase based on a comparison of the least one second input search data to the at least one second input stored data in the second memory bit cell;

wherein the first PFET-dominant evaluation circuit and the second PFET-dominant evaluation circuit are coupled to a supply voltage node receiving a supply voltage;

the first PFET-dominant evaluation circuit configured to charge the evaluation node to the supply voltage in the evaluation phase based on the comparison of the at least one first input search data to the at least one first input stored data; and the second PFET-dominant evaluation circuit configured to charge the evaluation node to the supply voltage in the evaluation phase based on the comparison of the at least one second input search data to the at least one second input stored data.

2. The dynamic tag compare system of claim 1, wherein:
the first PFET-dominant evaluation circuit is configured to not charge the evaluation node in the evaluation phase if the at least one first input search data matches the at least one first input stored data; and the second PFET-dominant evaluation circuit is configured to not charge the evaluation node in the evaluation phase if the at least one second input search data matches the at least one second input stored data.

3. The dynamic tag compare system of claim 1, wherein:
the first PFET-dominant evaluation circuit is configured to charge the evaluation node in the evaluation phase if the at least one first input search data does not match the at least one first input stored data; and the second PFET-dominant evaluation circuit is configured to charge the evaluation node in the evaluation phase if the at least one second input search data does not match the at least one second input stored data.

4. The dynamic tag compare system of claim 1, wherein:
the first PFET-dominant evaluation circuit is configured to charge the evaluation node in the evaluation phase if the at least one first input search data matches the at least one first input stored data; and the second PFET-dominant evaluation circuit is configured to charge the evaluation node in the evaluation phase if the at least one second input search data matches the at least one second input stored data.

5. The dynamic tag compare system of claim 1, wherein:
the first PFET-dominant evaluation circuit is configured to not charge the evaluation node in the evaluation phase if the at least one first input search data does not match the at least one first input stored data; and the second PFET-dominant evaluation circuit is configured to not charge the evaluation node in the evaluation phase if the at least one second input search data does not match the at least one second input stored data.

6. The dynamic tag compare system of claim 1, wherein:
the at least one first PFET is comprised of a first PFET comprising the at least one first search data input configured to receive the at least one first input search data, and a second PFET comprising the at least one first stored data input configured to receive the at least one first input stored data; and the at least one second PFET is comprised of a third PFET comprising the at least one second search data input configured to receive the at least one second input search data, and a fourth PFET comprising the at least one second stored data input configured to receive the at least one second input stored data.

7. The dynamic tag compare system of claim 6, wherein:
the first PFET comprises a gate coupled to the at least one first search data input configured to receive the at least one first input search data, and the second PFET comprises a gate coupled to the at least one first stored data input configured to receive the at least one first input stored data; and the third PFET comprises a gate coupled to the at least one second search data input configured to receive the at least one second input search data, and the fourth PFET comprises a gate coupled to the at least one second stored data input configured to receive the at least one second input stored data.

8. The dynamic tag compare system of claim 1, wherein:
the at least one first search data input is configured to receive at least one first input search bit, and the at least one first stored data input is configured to receive at least one first input stored bit; and the at least one second search data input is configured to receive at least one second input search bit, and the at least one second stored data input is configured to receive at least one second input stored bit.

9. The dynamic tag compare system of claim 8, wherein:
the at least one first PFET comprises:
a first PFET comprising a first complement search data input configured to receive at least one first complement input search bit, and a first true stored data input configured to receive at least one first true input stored bit; and a second PFET comprising a first true search data input configured to receive at least one first true input search bit, and a first complement stored data input configured to receive at least one first complement input stored bit;

the first PFET-dominant evaluation circuit configured to charge the evaluation node in the evaluation phase based on a comparison of the at least one first complement input search bit to the at least one first true input stored bit, and a comparison of the at least one first true input search bit to the at least one first complement input stored bit; and the at least one second PFET comprises:
a third PFET comprising a second complement search data input configured to receive at least one second complement input search bit, and a second true stored data input configured to receive at least one second true input stored bit; and a fourth PFET comprising a second true search data input configured to receive at least one second true input search bit, and a second complement stored data input configured to receive at least one second complement input stored bit;

the second PFET-dominant evaluation circuit configured to charge the evaluation node in the evaluation phase based on a comparison of the at least one second complement input search bit to the at least one second true input stored bit, and a comparison of the at least one second true input search bit to the at least one second complement input stored bit.

10. The dynamic tag compare system of claim 1, wherein the NFET-dominant pre-discharge circuit is configured to pre-discharge the evaluation node during the pre-discharge phase in response to a clock signal.

11. The dynamic tag compare system of claim 1, wherein the NFET-dominant pre-discharge circuit is configured to pre-discharge the evaluation node to a ground node during the pre-discharge phase.

12. The dynamic tag compare system of claim 1, wherein the NFET-dominant pre-discharge circuit is comprised of at least one NFET.

13. The dynamic tag compare system of claim 1, further comprising a keeper circuit coupled to the evaluation node, the keeper circuit configured to store a charge on the evaluation node in the evaluation phase based on the comparison of the at least one first input search data to the at least one first input stored data, and the at least one second input search data to the at least one second input stored data.

14. The dynamic tag compare system of claim 1, further configured to generate a match output signal on a match output coupled to the evaluation node indicating a result of the comparison of the at least first one input search data to the at least one first input stored data.

15. The dynamic tag compare system of claim 1 integrated into a system-on-a-chip (SoC).

16. The dynamic tag compare system of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

17. A dynamic tag compare system, comprising:
a means for pre-discharging an evaluation node through an N-type Field-Effect Transistor (FET) (NFET)-dominant pre-discharge circuit during a pre-discharge phase;
a first means coupled to a first memory bit cell in a memory for comparing at least one first input search data to at least one first input stored data, comprising:
a means for receiving the at least one first input search data;
a means for receiving the at least one first input stored data in the first memory bit cell; and
a means for charging the evaluation node through at least one first P-type FET (PFET) coupled to the evaluation node in an evaluation phase based on a comparison of the at least one first input search data to the at least one first input stored data in the first memory bit cell; and
a second means coupled to a second memory bit cell in the memory for comparing at least one second input search data to at least one second input stored data, comprising:
a means for receiving the at least one second input search data;
a means for receiving the at least one second input stored data in the second memory bit cell; and
a means for charging the evaluation node through at least one second PFET coupled to the evaluation node in the evaluation phase based on a comparison of the at least one second input search data to the at least one second input stored data in the second memory bit cell;

wherein the first means for comparing and the second means for comparing are coupled to a supply voltage node receiving a supply voltage;
the first means for comparing configured to charge the evaluation node to the supply voltage in the evaluation phase based on the comparison of the at least one first input search data to the at least one first input stored data; and
the second means for comparing configured to charge the evaluation node to the supply voltage in the evaluation phase based on the comparison of the at least one second input search data to the at least one second input stored data.

18. A method of performing a dynamic logic comparison of search data to stored data in a searchable memory, comprising:
pre-discharging an evaluation node through an N-type Field-Effect Transistor (FET) (NFET)-dominant pre-discharge circuit during a pre-discharge phase;
in an evaluation phase:
receiving at least one first input search data on at least one first search data input in a first P-type FET (PFET)-dominant evaluation circuit coupled to a first memory bit cell in a memory, the first PFET-dominant evaluation circuit comprising at least one first PFET coupled to the evaluation node;
receiving at least one first input stored data in the first memory bit cell on at least one first stored data input in the first PFET-dominant evaluation circuit;
comparing the received at least one first input search data to the received at least one first input stored data in the first PFET-dominant evaluation circuit;
receiving at least one second input search data on at least one second search data input in a second PFET-dominant evaluation circuit coupled to a second memory bit cell in the memory, the second PFET-dominant evaluation circuit comprising at least one second PFET coupled to the evaluation node;
receiving at least one second input stored data in the second memory bit cell on at least one second stored data input in the second PFET-dominant evaluation circuit;
comparing the received at least one second input search data to the received at least one second input stored data in the second PFET-dominant evaluation circuit; and
charging the evaluation node to a supply voltage received on a supply voltage node in the evaluation phase based on the comparison of the received at least one first input search data to the received at least one first input stored data, and the received at least one second input search data to the received at least one second input stored data.

19. The method of claim 18, wherein charging the evaluation node comprises charging the evaluation node in the evaluation phase if the at least one first input search data does not match the at least one first input stored data or the at least one second input search data does not match the at least one second input stored data.

20. The method of claim 18, wherein charging the evaluation node comprises not charging the evaluation node in the evaluation phase if the at least one first input search data matches the at least one first input stored data and the at least one second input search data matches the at least one second input stored data.

21. The method of claim 18, wherein charging the evaluation node comprises charging the evaluation node in the evaluation phase if the at least one first input search data matches the at least one first input stored data or the at least one second input search data matches the at least one second input stored data.

22. The method of claim 18, wherein charging the evaluation node comprises not charging the evaluation node in the evaluation phase if the at least one first input search data does not match the at least one first input stored data and the at least one second input search data does not match the at least one second input stored data.

23. The method of claim 18, comprising:
receiving the at least one first input search data on the at least one first search data input in the at least one first PFET comprising a first PFET in the first PFET-dominant evaluation circuit;
receiving the at least one first input stored data on the at least one first stored data input in the first PFET-dominant evaluation circuit;
receiving the at least one second input search data on the at least one second search data input in the at least one second PFET comprising a second PFET in the second PFET-dominant evaluation circuit; and
receiving the at least one second input stored data on the at least one second stored data input in the second PFET-dominant evaluation circuit.

24. The method of claim 18, comprising:
receiving the at least one first input search data comprising at least one first input search bit on the at least one first search data input in the first PFET-dominant evaluation circuit;
receiving the at least one first input stored data comprising at least one first input stored bit on the at least one first stored data input in the first PFET-dominant evaluation circuit;
comparing the received at least one first input search bit to the received at least one first input stored bit in the first PFET-dominant evaluation circuit;
receiving the at least one second input search data comprising at least one second input search bit on the at least one second search data input in the second PFET-dominant evaluation circuit;
receiving the at least one second input stored data comprising at least one second input stored bit on the at least one second stored data input in the second PFET-dominant evaluation circuit;
comparing the received at least one second input search bit to the received at least one second input stored bit in the second PFET-dominant evaluation circuit; and
charging the evaluation node in the evaluation phase based on the comparison of the at least one first input search bit to the at least one first input stored bit, and the at least one second input search bit to the at least one second input stored bit.

25. The method of claim 24, wherein:
receiving the at least one first input stored bit further comprises receiving the at least one first input stored bit on at least one first bit line from the first memory bit cell; and
receiving the at least one second input stored bit further comprises receiving the at least one second input stored bit on at least one second bit line from the second memory bit cell.

26. The method of claim 18, wherein pre-discharging the evaluation node comprises pre-discharging the evaluation node during the pre-discharge phase in response to a clock signal.

27. The method of claim 18, wherein pre-discharging the evaluation node comprises pre-discharging the evaluation node to a ground node during the pre-discharge phase.

28. The method of claim 18, further comprising storing a charge on the evaluation node in the evaluation phase in a keeper circuit based on the comparison of the at least one first input search data to the at least one first input stored data, and the at least one second input search data to the at least one second input stored data.

29. The method of claim 18, further comprising generating a match output signal on a match output coupled to the evaluation node indicating a result of the comparison of the at least one first input search data to the at least one first input stored data, and the comparison of the at least one second input search data to the at least one second input stored data.

30. A memory system, comprising:
a memory comprising a plurality of binary static bit cells each configured to store a true data bit and a complement data bit, and pass the true data bit to a true bit line and pass the complement data bit to a complement bit line, in response to a search operation, each binary static bit cell comprising:
a first inverter comprising a first input coupled to the complement bit line and a first output coupled to a second input of a second inverter; and
the second inverter comprising the second input coupled to the true bit line and a second output coupled to the first input of the first inverter; and
a P-type Field-Effect Transistor (FET) (PFET)-dominant tag compare circuit, comprising:
at least one pre-discharge circuit coupled to an evaluation node, the at least one pre-discharge circuit configured to pre-discharge the evaluation node during a pre-discharge phase;
a plurality of PFET-dominant evaluation circuits each coupled to a memory bit cell in the memory, each of the plurality of PFET-dominant evaluation circuits comprising:
at least one PFET coupled to the evaluation node;
a true search data input configured to receive a true input search bit;
a complement search data input configured to receive a complement input search bit;
a true stored data input configured to receive a true input stored bit from the true bit line of a binary static bit cell among the plurality of binary static bit cells; and
a complement stored data input configured to receive a complement input stored bit from the complement bit line of the binary static bit cell;
the PFET-dominant evaluation circuit configured to compare the true input search bit to the true input stored bit, and the complement input search bit to the complement input stored bit; and
each of the plurality of PFET-dominant evaluation circuits configured to charge the evaluation node in an evaluation phase based on the respective comparison of the true input search bit to the true input stored bit, and the comparison of the complement input search bit to the complement input stored bit;
wherein each of the plurality of PFET-dominant evaluation circuits is coupled to a supply voltage node receiving a supply voltage and is configured to charge the evaluation node to the supply voltage in the evaluation phase.

31. The memory system of claim 30, wherein each of the plurality of PFET-dominant evaluation circuits is further configured to not charge the evaluation node in the evaluation phase if the true input search bit matches the true input stored bit.

32. The memory system of claim 30, wherein each of the plurality of PFET-dominant evaluation circuits is further configured to charge the evaluation node in the evaluation phase if the true input search bit does not match the true input stored bit.

33. The memory system of claim 30, wherein each of the plurality of PFET-dominant evaluation circuits is further configured to not charge the evaluation node in the evaluation phase if the true input search bit does not match the true input stored bit.

34. The memory system of claim 30, wherein each of the plurality of PFET-dominant evaluation circuits is further configured to charge the evaluation node in the evaluation phase if the true input search bit matches the true input stored bit.

35. The memory system of claim 30, wherein the at least one PFET in each of the plurality of PFET-dominant evaluation circuits is comprised of a first PFET comprising the true input search bit configured to receive the true search data input, and a second PFET comprising the true input stored bit configured to receive the true stored data input.

36. The memory system of claim 30, wherein the at least one PFET in each PFET-dominant evaluation circuit among the plurality of PFET-dominant evaluation circuits comprises:
 a first PFET comprising the complement search data input configured to receive the complement input search bit, and the true stored data input configured to receive the complement input stored bit; and
 a second PFET comprising the true search data input configured to receive the true input search bit, and the complement stored data input configured to receive the true input stored bit.

37. The memory system of claim 30, wherein the at least one pre-discharge circuit is comprised of a single pre-discharge circuit configured to pre-discharge the evaluation node during the pre-discharge phase.

38. The memory system of claim 30, wherein the at least one pre-discharge circuit comprises at least one N-type FET (NFET)-dominant pre-discharge circuit.

39. The memory system of claim 30, further comprising at least one keeper circuit coupled to the evaluation node, the at least one keeper circuit configured to store a charge on the evaluation node in the evaluation phase based on the comparison of the true input search bit to the true input stored bit.

40. The memory system of claim 30, wherein the memory comprises a content-addressable memory (CAM).

41. The memory system of claim 30, wherein the memory comprises a register file.

42. The memory system of claim 30, provided in a central processing unit (CPU)-based system.

* * * * *